(12) United States Patent
Reeswinkel et al.

(10) Patent No.: US 12,199,224 B2
(45) Date of Patent: Jan. 14, 2025

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Thomas Reeswinkel, Regensburg (DE); Jens Eberhard, Lemgo (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 749 days.

(21) Appl. No.: 17/421,950

(22) PCT Filed: Jan. 9, 2020

(86) PCT No.: PCT/EP2020/050428
§ 371 (c)(1),
(2) Date: Jul. 9, 2021

(87) PCT Pub. No.: WO2020/144280
PCT Pub. Date: Jul. 16, 2020

(65) Prior Publication Data
US 2022/0029074 A1    Jan. 27, 2022

(30) Foreign Application Priority Data
Jan. 11, 2019   (DE) .......................... 102019100612.0

(51) Int. Cl.
*H01L 33/54* (2010.01)
*H01L 33/00* (2010.01)
(Continued)

(52) U.S. Cl.
CPC ............ *H01L 33/54* (2013.01); *H01L 33/005* (2013.01); *H01L 33/486* (2013.01); *H01L 33/62* (2013.01);
(Continued)

(58) Field of Classification Search
CPC ... H01L 33/005; H01L 33/483; H01L 33/486; H01L 33/52; H01L 33/54; H01L 33/56;
(Continued)

(56) References Cited

U.S. PATENT DOCUMENTS

2009/0146169 A1* 6/2009 Woo .................. H01L 33/56
257/E33.056
2013/0234186 A1* 9/2013 Katayama ............ H01L 33/005
428/161

(Continued)

FOREIGN PATENT DOCUMENTS

DE       102012201447 A1    8/2013
DE       102017107957 A1   10/2018
EP            2784833 A1   10/2014

*Primary Examiner* — David C Spalla
(74) *Attorney, Agent, or Firm* — Slater Matsil, LLP (57) ABSTRACT

In an embodiment an optoelectronic component includes a carrier, an optoelectronic semiconductor chip and an encapsulation, wherein the semiconductor chip is fixed on a mounting surface of the carrier and is electrically conductively connected with the carrier, wherein the encapsulation is located around the semiconductor chip and covers the mounting surface at least partially, wherein the encapsulation includes a first layer and a second layer, wherein the first layer is arranged between the mounting surface and the second layer, wherein each of the first layer and the second layer is based on a silicone, and wherein the first layer and the second layer are directly adjacent to each other in a region of an interface.

19 Claims, 3 Drawing Sheets

(51) Int. Cl.
*H01L 33/48* (2010.01)
*H01L 33/62* (2010.01)

(52) U.S. Cl.
CPC *H01L 2933/005* (2013.01); *H01L 2933/0066* (2013.01)

(58) Field of Classification Search
CPC ............... H01L 33/62; H01L 2924/181; H01L 2933/005; H01L 2933/0066
See application file for complete search history.

(56) References Cited

U.S. PATENT DOCUMENTS

| | | |
|---|---|---|
| 2015/0274894 A1 | 10/2015 | Sato et al. |
| 2016/0027977 A1 | 1/2016 | Seo et al. |
| 2018/0182933 A1* | 6/2018 | Abe .......................... F21K 9/90 |

* cited by examiner

OPTOELECTRONIC COMPONENT AND METHOD FOR PRODUCING AN OPTOELECTRONIC COMPONENT

This patent application is a national phase filing under section 371 of PCT/EP2020/050428, filed Jan. 9, 2020, which claims the priority of German patent application 102019100612.0, filed Jan. 11, 2019, each of which is incorporated herein by reference in its entirety.

TECHNICAL FIELD

An optoelectronic component and a method for producing an optoelectronic component are specified.

SUMMARY

Embodiments provide an optoelectronic component that is particularly stable to aging. Further embodiments provide a method for producing such an optoelectronic component.

According to at least one embodiment, the optoelectronic component comprises a carrier. The carrier comprises, for example, a leadframe and a housing body. The leadframe preferably comprises at least two sections electrically insulated from each other. The two sections are preferably assigned different polarities during intended operation of the component. The leadframe may be embedded in the housing body. The sections of the leadframe may be electrically insulated from each other by the housing body. The leadframe comprises, for example, copper. The housing body comprises or consists of, for example, a plastic or an epoxy. Preferably, the housing body is reflective to light in the visible spectral range. Alternatively, however, the carrier may be a ceramic carrier.

According to at least one embodiment, the optoelectronic component comprises an optoelectronic semiconductor chip. In the intended operation, the semiconductor chip preferably emits electromagnetic primary radiation, for example in the visible spectral range or in the UV range or in the infrared range. The optoelectronic component is in particular an LED. The optoelectronic component may be part of a headlight of a motor vehicle.

A semiconductor chip is understood here and in the following to mean an element that can be separately handled and electrically contacted. A semiconductor chip is produced in particular by separation from a wafer composite. In particular, side surfaces of such a semiconductor chip then comprise, for example, traces from the separation process of the wafer composite. A semiconductor chip preferably comprises exactly one originally contiguous region of a semiconductor layer sequence grown in the wafer composite. The semiconductor layer sequence of the semiconductor chip is preferably formed in a contiguous manner. The extension of the semiconductor chip measured parallel to the main extension plane of the semiconductor chip is, for example, at most 5% or at most 10% or at most 20% larger than the extension of the semiconductor layer sequence measured parallel to the main extension plane of the semiconductor chip.

The semiconductor layer sequence of the semiconductor chip is based, for example, on a III-V compound semiconductor material, in particular on a nitride compound semiconductor material. The semiconductor layer sequence comprises an active layer in which the electromagnetic primary radiation is generated in the intended operation. The active layer includes in particular at least one pn junction and/or at least one quantum well structure in the form of a single quantum well, abbreviated as SQW, or in the form of a multi-quantum well structure, abbreviated as MQW.

According to at least one embodiment, the optoelectronic component comprises an encapsulation. In the intended operation of the component, the encapsulation serves in particular to protect the optoelectronic semiconductor chip and/or the carrier from external influences, such as from the ingress of gases or moisture or pollutants or from mechanical influences. The encapsulation is preferably at least partially transparent to the primary radiation.

According to at least one embodiment, the semiconductor chip is mounted on a mounting surface of the carrier and is electrically conductively connected with the carrier. The mounting surface of the carrier is adapted, for example, to be flat and/or level within the manufacturing tolerance. The mounting surface may be configured to be metallic in regions. The mounting surface is preferably larger than the semiconductor chip, for example at least twice as large. The semiconductor chip may be bonded to the mounting surface, for example by means of a silicone-based adhesive, or soldered on.

In a lateral direction, parallel to the mounting surface, the semiconductor chip is preferably surrounded by a barrier. The barrier may be part of the carrier and is formed, for example, from the housing body. Preferably, the barrier protrudes the semiconductor chip in a direction away from the mounting surface. In other words, the carrier includes a recess. The barrier delimits the recess in a lateral direction. The mounting surface forms a bottom surface of the recess. The semiconductor chip is arranged in the recess of the carrier on the mounting surface. Preferably, the semiconductor chip is spaced from the barrier in the lateral direction.

The semiconductor chip may be electrically conductively connected with portions of the leadframe of the carrier. The optoelectronic component can then be contacted externally, for example, via a back side of the carrier opposite the mounting surface.

In addition to the optoelectronic semiconductor chip, one or more further electronic components can be arranged on the mounting surface, for example in the region of the recess. For example, another optoelectronic semiconductor chip and/or an ESD protection diode are attached to the mounting surface.

According to at least one embodiment, the encapsulation forms around the semiconductor chip and covers the mounting surface at least partially, preferably completely. Sections of the encapsulation may rest directly on the mounting surface. For example, the mounting surface directly rests on the mounting surface in the region adjacent to the semiconductor chip. Preferably, the encapsulation fills the recess of the carrier in which the semiconductor chip is arranged. Preferably, the encapsulation is laterally adjacent to the barrier. The semiconductor chip may be embedded in the encapsulation. For example, the encapsulation is applied directly to the semiconductor chip.

According to at least one embodiment, the encapsulation comprises a first layer and a second layer. Preferably, the first layer is arranged between the mounting surface and the second layer. In particular, along the entire lateral extent of the encapsulation or substantially along the entire lateral extent of the encapsulation, the first layer is arranged between the mounting surface and the second layer.

For example, the second layer covers most or all of the first layer when viewed in a top view of the mounting surface. For example, all regions of the first layer that do not face the carrier or semiconductor chip are covered by the second layer. When viewed from above the mounting surface, the first layer preferably covers all regions of the mounting surface, in particular all metallic or corrosion-prone regions of the mounting surface, laterally adjacent to the semiconductor chip. In particular, the first layer completely covers these regions. Particularly preferably, viewed from above the mounting surface, the first layer covers the entire mounting surface.

The first layer may be directly adjacent to the semiconductor chip and/or the mounting surface. The first layer and/or the second layer may be at least partially transparent to primary radiation emitted by the semiconductor chip. The encapsulation may comprise one or more additional layers or may consist of only the first and second layer. Preferably, the second layer is not in direct contact with the mounting surface. Preferably, the second layer is spaced everywhere from the mounting surface by the first layer and, if present, by the housing body.

According to at least one embodiment, the first layer and the second layer are each based on a silicone. For example, the first and/or the second layer are based on a silicone. The first and the second layer may be based on or consist of the same silicone. Alternatively, it is also conceivable that the silicone of the second layer is different from the silicone of the first layer. Possible silicones for the first and/or second layer include, inter alia: thermosetting, addition-cured 2-component silicones, and dimethylsiloxane-based elastomers, respectively. Silicones are also referred to as polysiloxanes. Preferably, the first layer is the closest silicone-based layer in the component to the mounting surface.

According to at least one embodiment, the first layer and the second layer are directly adjacent to each other in the region of an interface. The interface is preferably a visually perceptible boundary between the first layer and the second layer. For example, within the manufacturing tolerance, the interface is simply connected, i.e., free of interruptions where the first layer is not adjacent to the second layer. When viewed from above the mounting surface, the interface preferably covers all regions of the mounting surface laterally adjacent to the semiconductor chip.

In particular, the interface indicates that the first layer and the second layer were applied sequentially and independently of each other. In particular, the interface indicates that the silicone of the first layer was partially or fully cured before the silicone of the second layer was applied. The interface may also be a boundary layer, for example, with a thickness of at most 10 nm or at most 5 nm. With other words, the first layer and the second layer are not arranged integrally with each other or are not formed from a single casting. However, the first layer and the second layer may each be integrally formed or formed from a casting.

At or in the interface between the first layer and the second layer, for example, the material structure of the silicone is different from the material structure of the silicone inside the first layer and/or inside the second layer. For example, the silicone at the interface is more cross-linked or comprises more interconnection points or comprises a higher density than inside the first and/or second layer.

If the carrier comprises a housing body and a recess surrounded by a barrier, the encapsulation preferably fills the recess. In particular, the interface and preferably the second layer extend exclusively within the recess. For example, the interface is completely delimited by the barrier in the lateral direction.

In at least one embodiment, the optoelectronic component comprises a carrier, an optoelectronic semiconductor chip and an encapsulation. The semiconductor chip is mounted on a mounting surface of the carrier and electrically conductively connected with the carrier. The encapsulation surrounds the semiconductor chip and at least partially covers the mounting surface. The encapsulation includes a first layer and a second layer, wherein the first layer is disposed between the mounting surface and the second layer. The first layer and the second layer are each based on a silicone. The first layer and the second layer are directly adjacent to each other at an interface.

Embodiments of the present invention are based, inter alia, on the recognition that many optoelectronic components comprise a carrier which is at least partially coated with silver. In addition to good electrical and thermal connection for the semiconductor chip, silver offers very high reflectivity for radiation emitted by the semiconductor chip, in particular for visible light. This can increase the efficiency of the component. Particularly in the case of semiconductor chips in the form of volume emitters, for example sapphire chips, a large proportion of the light emitted by the semiconductor chip can impinge the carrier during operation. However, silver is very sensitive to corrosion, especially to gases such as $H_2S$. The surface of the silver then turns dark (brown/black) when in contact with such a gas. As a result, less light is reflected and the reflection also becomes wavelength-dependent. Consequently, the component then emits less light and/or a changed light color.

Silicones are often used as encapsulants to encapsulate and protect the carrier and the semiconductor chip. These are significantly more light-stable than epoxy resins, for example. However, the gas permeability of silicones is usually relatively high, so that harmful gases, such as $H_2S$, can easily penetrate to the silver surface. So, as a result, the component is more light and color stable to normal aging, but sensitive to corrosive gases. This can be particularly problematic when the optoelectronic component is used in road traffic, for example as a headlight in a vehicle or as a means of illumination in a tunnel.

In embodiments of the present invention, particular use is made of the idea of using a multilayer silicone encapsulation. At the interface between the layers, interfacial effects result in significantly reduced diffusion of harmful gases toward the carrier or toward the semiconductor chip. Surprisingly, the interface comprises a significantly higher barrier effect compared to the bulk material of the layers. In addition, the interface also has a high barrier effect against volatile organic compounds (VOCs). This reduces the risk of brightness degradation caused by penetrated, organic compounds.

It is also advantageous that the silicones of the first layer and the second layer do not then have to be optimized for low permeability to gases or volatile, organic compounds, because the high barrier effect is achieved by the interface. The silicones can therefore be selected to be optimized for other properties.

Thus, the present optoelectronic component is more stable to aging than commonly used components, in particular due to the interface between the first layer and the second layer, and is suitable for use in motor vehicles or in street lighting devices.

According to at least one embodiment, the semiconductor chip is embedded in the first layer. In particular, when viewed from a top view of the mounting surface, the first layer completely covers the semiconductor chip. The first layer may, for example, be in positive and/or direct contact with the semiconductor chip. All sides of the semiconductor chip not facing the mounting surface are then preferably completely covered by the first layer.

According to at least one embodiment, viewed in a top view of the mounting surface, the semiconductor chip is covered, in particular completely covered, by the interface. Preferably, the entire side of the first layer facing away from the mounting surface is in direct contact with the second layer. Because the interface covers the semiconductor chip, the probability of diffusion of harmful gases to the semiconductor chip is reduced.

The second layer may be adapted to be thinner than the first layer. For example, the maximum thickness of the second layer is at most half or at most a quarter or at most a fifth of the maximum thickness of the first layer. Here, the thickness is understood as an extension perpendicular to the mounting surface. For example, the maximum thickness of the second layer is at most 100 µm or at most 50 µm or at most 10 µm or at most 5 µm or at most 1 m. Since the barrier effect is predominantly achieved by the interface, a high thickness of the second layer is not necessary.

According to at least one embodiment, the first layer and the second layer are based on the same silicone. The first layer and the second layer may comprise the same material composition within the manufacturing tolerance.

According to at least one embodiment, the first layer and the second layer are based on different silicones.

According to at least one embodiment, the silicone of the second layer comprises a smaller refractive index than the silicone of the first layer. This is advantageous in terms of the efficiency of coupling out of the component radiation generated by the component. Here, the refractive index for the radiation generated by the component is meant.

Silicones with low refractive index are generally less dense to gases than silicones with high refractive index. This is of little concern in the present invention because the interface efficiently prevents diffusion of gases.

For example, the refractive index of the silicone of the second layer is at least 0.03 or at least 0.06 or at least 0.12 less than the refractive index of the silicone of the first layer.

According to at least one embodiment, the silicone of the second layer comprises a higher permeability to gases, for example to water vapor and/or $H_2S$, than the first layer. For example, the permeability of the silicone of the second layer, specified in units of $\mu g \cdot cm^{-2} \cdot min^{-1}$, is at least 50% or at least 100% or at least 200% or at least 500% greater than that of the silicone of the first layer.

According to at least one embodiment, any path from outside the component to the first layer or into the first layer that passes exclusively through silicone-based material also passes through the interface and thus also through the second layer. That is, any path running exclusively through silicone, along which contaminants could pass from outside the component into the first layer and from there on to the mounting surface, also crosses the interface and is thus well protected by the interface.

According to at least one embodiment, the interface extends across the entire mounting surface of the carrier. Thus, when viewed from a top view of the mounting surface, the interface between the first layer and the second layer completely covers the mounting surface. In this way, the risk of diffusion of harmful gases up to the mounting surface is reduced.

According to at least one embodiment, the mounting surface is at least partially formed of silver and/or a silver alloy and/or copper. In particular, the leadframe is coated with silver or a silver alloy or copper in the region of the mounting surface. For example, regions of the mounting surface laterally adjacent to the semiconductor chip are formed of silver/silver alloy/copper. Preferably, at least 25% or at least 50% of the area of the mounting surface laterally adjacent to the semiconductor chip is formed of silver or silver alloy or copper. A silver-containing mounting surface provides a high reflectance for radiation incident on the carrier.

According to at least one embodiment, an adhesive with which the semiconductor chip is bonded to the mounting surface comprises silver particles. Thus, it is a silver conductive adhesive. In this case, the mounting surface may be at least partially formed of silver or a silver alloy, but may also be formed of non-corrosive materials, such as gold. The silver-containing adhesive can provide electrical and/or thermal bonding of the semiconductor chip to the mounting surface.

According to at least one embodiment, the first layer is surface-treated in the interface region. In particular, the surface of the first layer exposed prior to application of the second layer is surface treated. The surface treatment may in particular be a plasma treatment. Residues of the surface treatment are then present and detectable at the interface, for example. The residues may be, for example, amino groups. Also, the chemical surface structure of the silicone of the first layer may have been changed by the surface treatment. The surface treatment of the first layer in the interface region can ensure a particularly reliable mechanical bond between the first layer and the second layer.

According to at least one embodiment, the first layer and/or the second layer are free of converter materials and/or free of scattering materials within the manufacturing tolerance. For example, negligible concentrations of converter particles or scattering particles are present in the first layer and/or second layer. For example, the mass fraction of converter particles and scattering particles in the first and/or second layer is at most 1% by weight.

Alternatively, however, it is also conceivable that the first layer and/or the second layer comprise converter particles or scattering particles in order to at least partially convert or scatter the primary radiation emitted by the semiconductor chip. The mass fraction of converter particles and/or scattering particles in the first and/or second layer may then be at least 10 wt % or at least 30 wt % or at least 50 wt %.

According to at least one embodiment, the optoelectronic component further comprises an inorganic encapsulation layer that at least partially, preferably completely, covers the mounting surface. Preferably, the encapsulation layer also completely covers the semiconductor chip, for example all sides of the semiconductor chip that do not face the mounting surface. In addition, the encapsulation layer preferably covers the regions of the mounting surface laterally adjacent to the semiconductor chip. Preferably, the encapsulation layer is adapted to be simply connected.

According to at least one embodiment, the inorganic encapsulation layer comprises or consists of one or more oxides or oxinitrides or nitrides. The one or more oxides or oxinitrides or nitrides may comprise one or more elements of the following group: Silicon, Aluminum, Titanium, Zinc, Indium, Tin, Niobium, Tantalum, Hafnium, Zirconium, Yttrium, or Germanium. For example, the inorganic encapsulation layer comprises or consists of silicon oxide, aluminum oxide, titanium oxide, zinc oxide, indium oxide, tin oxide, tantalum oxide, niobium oxide, hafnium oxide, zirconium oxide, yttrium oxide, silicon nitride, aluminum nitride, or germanium nitride. The inorganic encapsulation layer may be applied by physical vapor deposition (PVD) or chemical vapor deposition, such as PECVD, or atomic layer deposition (ALD).

According to at least one embodiment, the inorganic encapsulation layer is disposed between the encapsulation and the carrier. In particular, the inorganic encapsulation layer may be disposed between the first layer of the encapsulation and the carrier. The encapsulation layer may be directly applied to the semiconductor chip and/or the mounting surface. In turn, the first layer of encapsulation may be directly applied to the encapsulation layer. The encapsulation layer may, for example, cover, in particular completely cover, all sides of the carrier and/or the semiconductor chip facing the first layer of encapsulation.

According to at least one embodiment, the encapsulation layer comprises a thickness between 5 nm and 500 nm inclusive, preferably between 5 nm and 100 nm inclusive, particularly preferably between 15 nm and 75 nm inclusive. The numerical data refer, for example, to a maximum thickness of the encapsulation layer.

An inorganic encapsulation layer is in principle particularly dense with respect to harmful gases, such as $H_2S$. However, such an inorganic encapsulation layer shows weaknesses at mechanically or geometrically challenging points, for example at the transition from the leadframe to the housing body or in the region of an adhesive with which the semiconductor chip is applied to the carrier, or in the region of undercuts. Mechanical or thermomechanical stresses, for example during processing or soldering of the component, can cause cracks in the inorganic encapsulation layer through which the harmful gases can diffuse. Corrosion of the mounting surface can then occur in the region of the cracks.

These weaknesses of the inorganic encapsulation layer are covered by the encapsulation with the at least two silicone-based layers. Overall, a particularly aging-resistant component can thus be realized by combining the inorganic encapsulation layer and the encapsulation.

According to at least one embodiment, the optoelectronic semiconductor chip is a volume emitter, for example a sapphire chip or a flip chip. In this case, the semiconductor chip still comprises, in particular, the growth substrate on which the semiconductor layer sequence of the semiconductor chip is grown. The growth substrate may be sapphire. In the intended operation of the semiconductor chip, radiation is then emitted both via a main emission side and via side surfaces of the semiconductor chip extending transversely to the main emission side. For example, at least 20% of the primary radiation generated in the semiconductor chip during operation is emitted from the semiconductor chip via the main emission side and at least 10% is emitted via each of the side surfaces. The semiconductor chip is mounted on the mounting surface in particular such that the main emission side faces away from the mounting surface. The side surfaces of the semiconductor chip extend transversely or perpendicularly to the mounting surface.

Alternatively, it is also conceivable that the semiconductor chip is a surface emitter in which virtually no primary radiation is coupled out via side surfaces of the semiconductor chip. For example, in a surface emitter, at least 90% of the generated radiation is coupled out via the main emission side. In this case, the main emission side preferably faces away from the mounting surface of the carrier. In a surface emitter, the growth substrate of the semiconductor layer sequence is preferably detached.

According to at least one embodiment, the semiconductor chip is electrically conductively connected to the carrier via at least one contact wire. The contact wire may, for example, be soldered to a region of the mounting surface laterally adjacent to the semiconductor chip. The semiconductor chip may be electrically conductively connected to the carrier via one or more contact wires.

According to at least one embodiment, the contact wire is embedded, in particular fully embedded, in the first layer. Preferably, the contact wire does not protrude into the second layer. Viewed in a top view, the contact wire is covered, in particular completely covered, by the interface. For example, the first layer surrounds the contact wire in a form-fit manner. The first layer may be in direct contact with the contact wire.

According to at least one embodiment, the contact wire comprises or consists of silver or a silver alloy. For example, the contact wire is coated with silver or a silver alloy.

Furthermore, a method for producing an optoelectronic component is specified. The method is particularly suitable for producing an optoelectronic component as just described. That is, all features disclosed in connection with the optoelectronic component are also disclosed for the method, and vice versa.

According to at least one embodiment, the method for producing an optoelectronic component comprises a step A) in which a carrier with a mounting surface is provided. In a step B), an optoelectronic semiconductor chip is applied to the mounting surface and electrically connected with the carrier. In a step C), a silicone-based first layer is adapted on the mounting surface. For this purpose, a silicone-based first material is applied to the mounting surface in a liquid or viscous state and then at least partially cured. The first layer subsequently forms the semiconductor chip. In a step D), a silicone-based second layer is adapted directly on a side of the first layer facing away from the mounting surface. For this purpose, a silicone-based second material in a liquid or viscous state is applied directly to the first layer and then cured.

In the present context, a liquid or viscous material is understood to mean, for example, a material with a viscosity of at most 104 mPa·s or at most 105 mPa·s.

For example, the carrier comprises a recess, wherein a bottom surface of the recess forms the mounting surface. Laterally, the recess is bounded by a barrier of the carrier. In particular, the barrier is formed by the housing body. The semiconductor chip is applied to the mounting surface in particular in the region of the recesses. The recess is preferably deeper than the semiconductor chip is thick. After the semiconductor chip has been applied, the semiconductor chip preferably does not project beyond the barrier. Thus, the semiconductor chip does not protrude from the recess.

When applying the first material in step C), for example, the recess is partially filled with the first material, wherein the semiconductor chip is embedded in the first material. Preferably, in step C), all regions of the mounting surface that are not covered by the semiconductor chip are completely covered by the first material. Particularly preferably, the semiconductor chip is completely embedded in the first material. That is, the semiconductor chip then does not protrude from the first layer formed in this way.

Subsequently, in step D), a second material is applied directly to an exposed surface, in particular to the entire exposed surface, of the first layer. The second material is also filled into the recess of the carrier, for example. The second material may be applied, for example, by spray coating.

The second material is applied directly to the first layer so that the second layer and the first layer are directly adjacent to each other in the region of an interface. The second material in step D) may comprise the same composition as the first material in step C). If the first material was not fully cured in step C), it may be fully cured after step D) together with the second material.

The first material and the second material are based on silicone and are based on polysiloxane, respectively. The first and second materials may each comprise or consist of mixtures of different polysiloxanes, for example components of a 2K-silicone. The polysiloxane polymers comprise, for example, initially predominantly hardly crosslinked, for example predominantly difunctional, polymer molecules/units. Through curing, the components crosslink at further functionalities and form multiple crosslinked polymer molecule chains, so that a network is formed and the differentiability of the individual, previously present polymer molecules is no longer given, since they are linked at least at three positions with another polysiloxane. The first and second layers of the finished component are then based on these polysiloxanes, which are crosslinked compared to the starting materials.

According to at least one embodiment, steps A) to D) are carried out in the order indicated and in succession.

According to at least one embodiment, after step C) and before step D), a surface of the first layer facing away from the mounting surface is surface treated, in particular plasma treated. Preferably, the entire surface of the first layer exposed after step C) is surface treated. For example, the surface of the first layer is exposed to a noble gas plasma, such as an argon plasma, or another plasma. The surface treatment creates, for example, unsaturated bonds (radicals) and hydroxyl, hydroperoxide, carboxyl, and/or carbonyl groups, making it easier to form a bond to the subsequently applied second material. In addition, treatment with ammonia, for example, can lead to the formation of amino functionalities.

It is also assumed that the surface treatment of the first layer is advantageous for the barrier effect of the interface between the first layer and the second layer that is formed later. The surface treatment can increase the degree of crosslinking of the first and/or second silicone in the region of the treated surface of the first silicone or of the interface formed there during application of the second silicone.

According to at least one embodiment, an inorganic encapsulation layer is applied to the mounting surface, and preferably also to the semiconductor chip, prior to step C). The encapsulation layer is applied, by for example, by means of a PVD or (PE) CVD method or ALD method. The inorganic encapsulation layer is applied, for example, to all exposed areas of the semiconductor chip and/or the mounting surface. The encapsulation layer may be applied directly to the semiconductor chip and/or the mounting surface. In step C), the first layer may be adapted directly on the encapsulation layer.

According to at least one embodiment, at least 50% or at least 75% or at least 85% or at least 90% or at least 95% or at least 99% of the polymers of the second material are silane and/or silanol functionalized. That is, these polymers comprise at least one functional group in the form of a silane functionality or silanol functionality.

The polymers are in particular polysiloxane polymers, for example with predominantly difunctional units. Silane functionalities are hydrosiloxane groups, silanol functionalities are hydroxysiloxane groups. These functional groups can react with the functional groups, for example formed by a plasma treatment or still present due to incomplete curing, of the silicone of the first layer and thereby form a locally more crosslinked interface compared to the base materials cured per se at this point.

For example, the silane- and/or silanol-functionalized polymers are poly(dimethylsiloxane-co-methylhydrosiloxane) or poly(dimethylsiloxane-co-methylhydroxysiloxane) or silanol compounds. The polymers may be trimethylsilyl-terminated. The silane-functionalized polymers may be the silane-containing component of commercial 2K-silicones, for example, a pure substance such as CAS 68037-59-2, CAS 68951-93-9 or CAS 7031-67-8.

When the second material is applied, it has, for example, a viscosity between 10 mPa·s and 10000 mPa·s, inclusive. The second material is applied, for example, by dip coating or spray coating.

According to at least one embodiment, on average at least 3% or at least 10% or at least 50% or at least 75% of the functionalities/functional groups of the silane- or silanol-functionalized polymers are silane or silanol functionalities.

Silane- and/or silanol-functionalized polymers that do not then crosslink can subsequently be gently removed and recycled by purification processes, if necessary. By choosing the second material with a high number of silane- and/or silanol-functionalized polymers, a highly crosslinked interface can be realized on the surface of the first silicone with a residual reactivity, for example by plasma treatment. The thickness of the resulting second silicone-based layer can be small.

Silanol functionalities can also be formed only in situ, i.e. preferably after application or during/after mixing of the second material from silane functionalities due to the large surface area and low layer thickness. This occurs, for example, through reaction with atmospheric moisture.

After the second material has been applied, it preferably acts for a longer time, for example at least 30 minutes, if necessary with the application of heat.

Further layers may also be applied/formed thereafter to provide multiple interfaces. All features disclosed in connection with the second layer are disclosed accordingly also for the further layers.

According to at least one embodiment, at least 3 mol % or at least 10 mol % or at least 50 mol % or at least 75 mol % of the functionalizations of the polymers of the second material, which may represent, for example, a mixture in the range from 1:1 up to 100:1 of polysiloxanes or a mixed, commercial 2K-silicone or also a pure substance such as CAS 68037-59-2, are silane and/or silanol functionalized.

According to at least one embodiment, the carrier is provided in a carrier composite comprising a plurality of interconnected carriers. The carrier composite is singulated after step D).

BRIEF DESCRIPTION OF THE DRAWINGS

Further advantages and advantageous designs and further embodiments of the optoelectronic component and of the method for producing the optoelectronic component result from the following exemplary embodiments shown in connection with the figures. Elements that are identical, of the same type or have the same effect are provided with the same reference signs in the figures. The figures and the proportions of the elements shown in the figures are not to be regarded as to scale. Rather, individual elements may be shown exaggeratedly large for better representability and/or for better comprehensibility.

DETAILED DESCRIPTION OF ILLUSTRATIVE EMBODIMENTS

Figure 1:
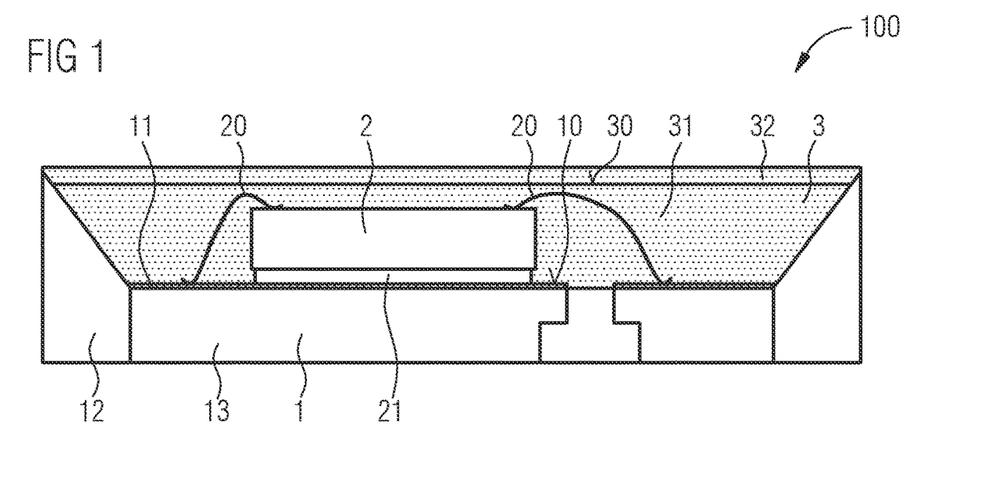
FIGS. 1 and 2 show exemplary embodiments of an optoelectronic component in cross-sectional view.

In FIG. 1, a first exemplary embodiment of the optoelectronic component 100 is shown in cross-sectional view. The component 100 comprises a carrier 1 and an optoelectronic semiconductor chip 2. The carrier 1 comprises a leadframe 13 embedded in a housing body 12. In the present case, the leadframe 13 comprises two sections which are electrically insulated from each other and spaced apart by the housing body 12. The two sections of the leadframe 13 are at different potentials during intended operation. The leadframe 13 comprises copper, for example.

The housing body 12 is preferably reflective to a primary radiation generated by the semiconductor chip 2 in operation. For example, the housing body 12 is based on an epoxy resin or a plastic, in particular a white plastic.

The carrier 1 includes a mounting surface 10 on which the semiconductor chip 2 is mounted. The mounting surface 10 forms a bottom surface of a recess of the carrier 1. The recess is laterally surrounded by a barrier made of the housing body 12. The semiconductor chip 2 is assembled in the recess of the carrier and does not protrude from the recess.

The mounting surface 10 is formed in sections by a silver coating 11.

In the present case, the semiconductor chip 2 is adapted as a volume emitter. For example, the semiconductor chip 2 comprises a semiconductor layer sequence based on a III-V compound semiconductor material. An active layer in the semiconductor layer sequence generates, for example, primary radiation in the blue spectral range or in the UV range during intended operation of the semiconductor chip 2. Furthermore, the semiconductor chip 2 comprises the growth substrate on which the semiconductor layer sequence is grown. For example, the semiconductor chip 2 is applied to the mounting surface 10 with the growth substrate first. The semiconductor chip 2 is fixed to the mounting surface 10 with the aid of an adhesive layer 21, which is based on silicone, for example. The semiconductor chip 2 is electrically conductively connected to the two sections of the leadframe 13 via contact wires 20.

An encapsulation 3 is applied to the mounting surface 10 and around the semiconductor chip 2. The encapsulation 3 fills the recess of the carrier 1. The encapsulation 3 comprises a first layer 31 and a second layer 32. Both the first layer 31 and the second layer 32 are based on a silicone. In this regard, the first layer 31 is disposed between the second layer 32 and the mounting surface 10. The semiconductor chip 2 is fully embedded in the first layer 31 and does not protrude into the second layer 32. Similarly, the contact wires 20 are embedded in the first layer 31 and do not extend into the second layer 32.

The second layer 32 is substantially thinner than the first layer 31. For example, the maximum thickness of the second layer 32 is at most one quarter of the maximum thickness of the first layer 31. The first 31 and second layers 32 may be based on the same silicone. Each of the layers 31, 32 may be made of silicone and may be free of converter particles or stray particles within the manufacturing tolerance. Preferably, however, the first layer 31 comprises converter particles or stray particles.

The second layer 32 is applied directly to the surface of the first layer 31 facing away from the carrier 1. In particular, the second layer 32 covers all regions of the first layer 31 that do not face the carrier 1 or the semiconductor chip 2.

An interface 30 is adapted between the first layer 31 and the second layer 32, which can be seen with the naked eye or under a microscope, for example. The interface 30 may in particular be a thin interface layer. When viewed from a top view of the mounting surface 10, the interface 30 completely covers the semiconductor chip 2 and the mounting surface 10.

The interface 30 between the first layer 31 and the second layer 32 forms a good barrier against gases, such as $H_2S$. In this regard, the barrier effect of the interface 30 is greater than the barrier effect of the first layer 31 and the second layer 32. The interface 30 can prevent or suppress harmful gases from penetrating to the mounting surface 10, and causing corrosion of the silver coating 11 there. Also, the interface 30 protects against the penetration of volatile organic compounds (VOCs) that could discolor when irradiated with the primary radiation, and distort the color impression emitted by the component 100.

Figure 2:
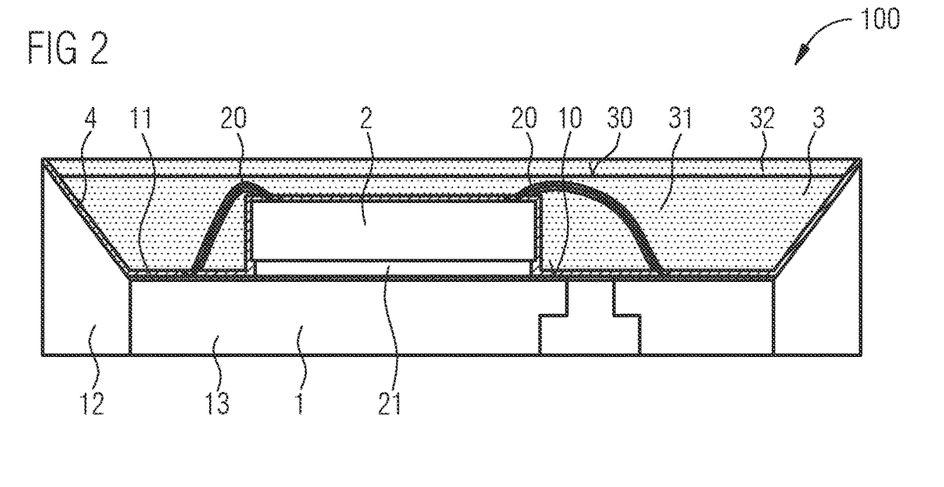

FIG. 2 shows a second exemplary embodiment of the optoelectronic component 100. The component 100 of FIG. 2 is essentially constructed in the same way as the component 100 of FIG. 1, but in FIG. 2 an inorganic encapsulation layer 4 is also applied between the first layer 31 and the carrier 1. The inorganic encapsulation layer 4 comprises, for example, $SiO_2$ or $Al_2O_3$. The encapsulation layer 4 is thereby in direct contact with the mounting surface 10 and the semiconductor chip 2. In particular, the encapsulation layer 4 covers all sides of the semiconductor chip 2 that do not face the mounting surface 10. The encapsulation layer 4 may be applied directly to the mounting surface 10 and the semiconductor chip 2. In addition to the semiconductor chip 2, the encapsulation layer 4 also encapsulates the contact wires 20. For example, the encapsulation layer 4 comprises a thickness between 5 nm and 200 nm, inclusive.

In addition to the encapsulation 3, the encapsulation layer 4 forms another good barrier against harmful gases. However, the encapsulation layer 4 can easily tear at edges or steps or in the region of the adhesive layer 21. For this case, the encapsulation 3 with the interface 30 between the two layers 31, 32 also covers the cracks within the encapsulation layer 4, which makes the component 100 particularly durable.

Figure 3A:
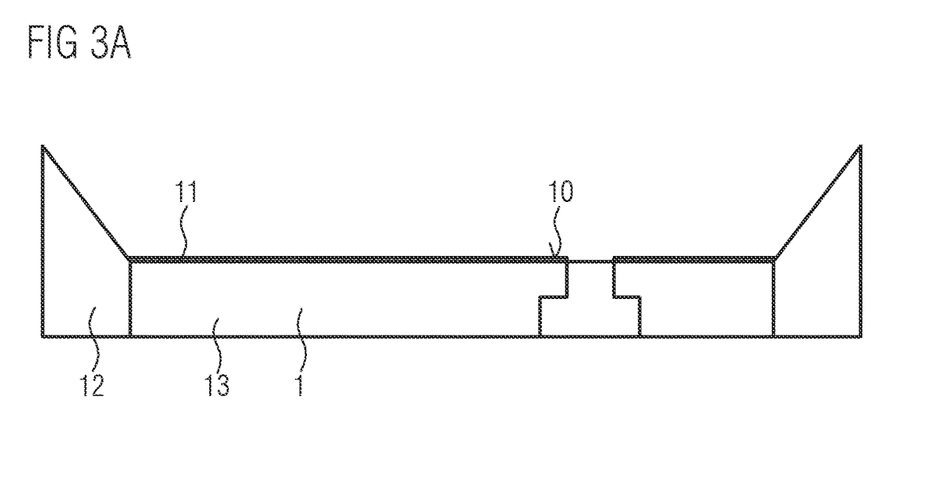
FIGS. 3A to 3D show different positions in an exemplary embodiment of the method for producing an optoelectronic component.

FIG. 3A shows a first position of an exemplary embodiment of the method for producing an optoelectronic component. In this position, a carrier 1 is provided as described in connection with the previous exemplary embodiments.

Figure 3B:
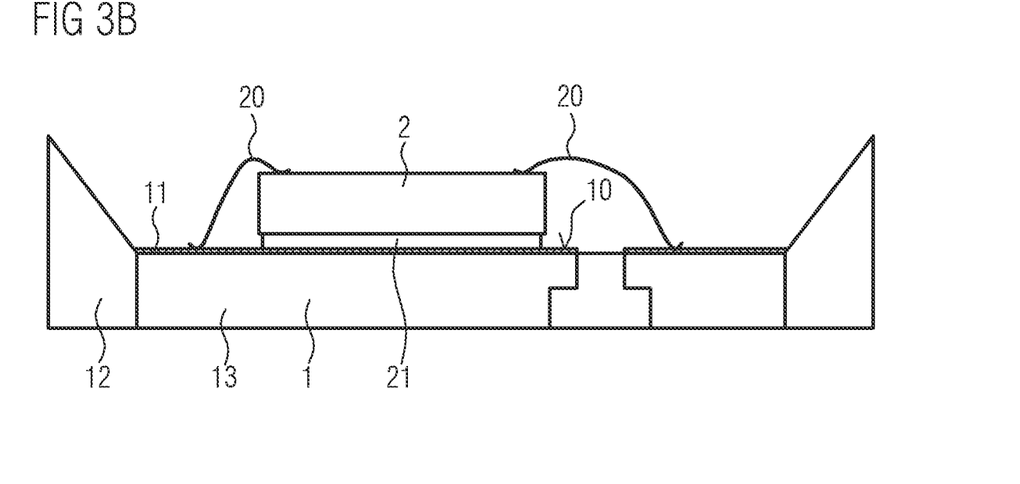

In FIG. 3B, a second position of the method is shown in which a semiconductor chip 2 is mounted on the mounting surface 10 in the recess region. Also, the semiconductor chip 2 is electrically conductively connected to the carrier 1 via contact wires 20.

Figure 3C:
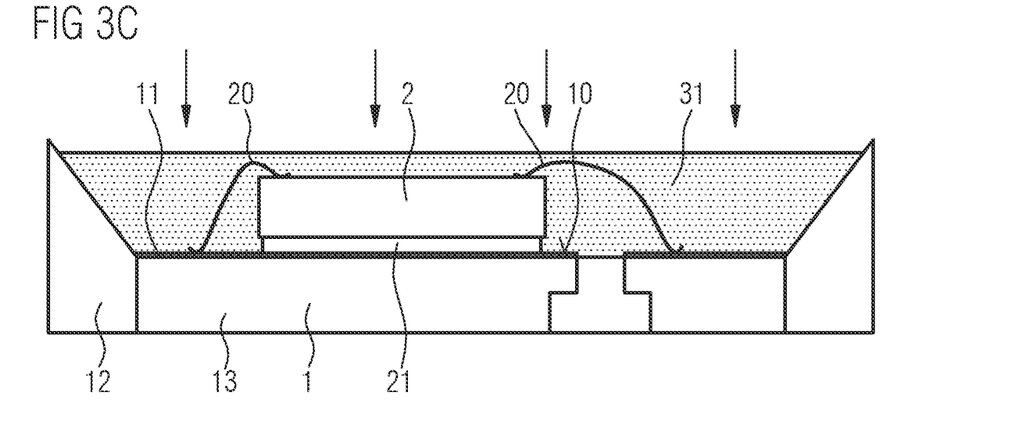

In FIG. 3C, a position in the method is shown in which a silicone-based first layer 31 is adapted on the mounting surface 10 and extending around the semiconductor chip 2. For this purpose, the recess was partially filled with a silicone or silicone-based first material so that the semiconductor chip 2 was completely embedded in the silicone-based first material. The first material was thereby applied in a liquid or viscous state. Subsequently, the first material was fully or partially cured, forming the first layer 31.

FIG. 3C also shows how the exposed surface of the first layer 31 is surface treated (shown by vertical arrows). For example, the surface of the first layer 31 is exposed to a plasma, such as an argon plasma.

Figure 3D:
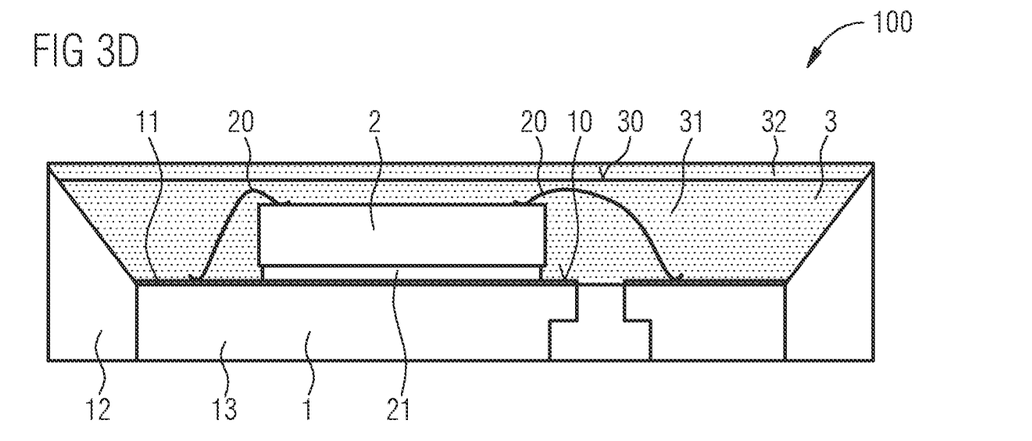

FIG. 3D shows a fourth position in the method after the surface treatment of the first layer 31 has been completed. A silicone-based second material is now directly applied to the entire surface-treated surface of the first layer 31. Preferably, the second material is also applied in a liquid or viscous state. The second material is then cured to form a second layer 32. In this process, the first layer 31 may also be finally cured. An interface 30 is adapted between the first layer 31 and the immediately adjacent second layer 32, which has a particularly high barrier effect for gases. FIG. 3D also shows the finished optoelectronic component of FIG. 1.

Figure 4:
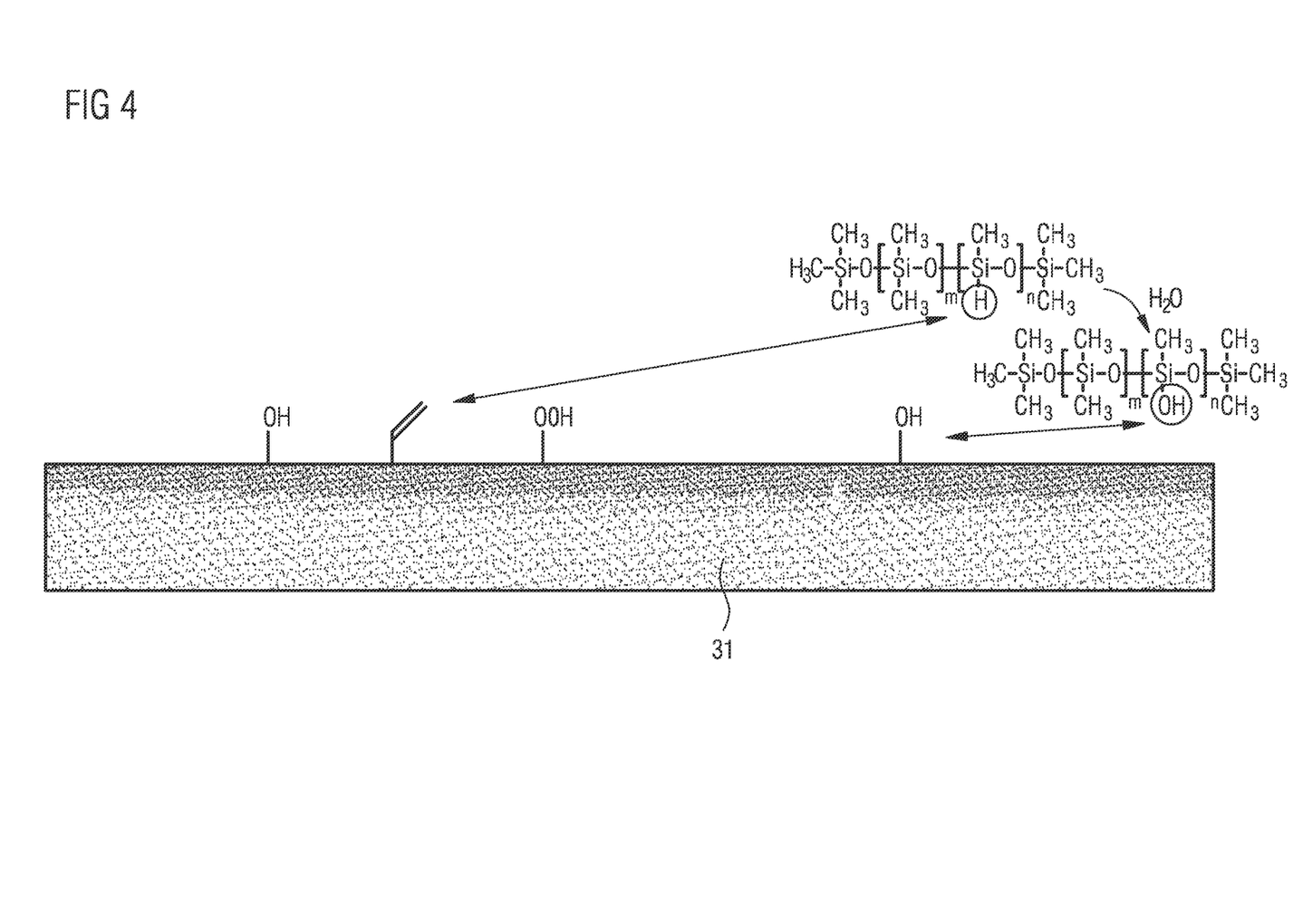
FIG. 4 shows a position in an exemplary embodiment of the method.

FIG. 4 shows a position during the application of the second material to the first layer 31 of FIG. 3D. The second material comprises or consists of polysiloxane polymers. Some of these polymers comprise silane functionalities, that is, hydrogen atoms directly bonded to Si atoms. From these silane functionalities, at least partial silanol functionalities can be formed upon reaction with water, i.e., OH groups directly bonded to a Si atom. Alternatively, the polymers can be provided already with silanol functionalities.

The silane and/or silanol functionalities can now bond to, among other things, functional groups of the first layer 31 formed by the plasma treatment, and thus an interface 30 is formed with a higher degree of crosslinking.

This patent application claims priority to German patent application 10 2019 100 612.0, the disclosure content of which is hereby incorporated by reference.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. An optoelectronic component comprising:
a carrier;
an optoelectronic semiconductor chip; and
an encapsulation,
wherein the semiconductor chip is fixed on a mounting surface of the carrier and is electrically conductively connected with the carrier,
wherein the encapsulation is located around the semiconductor chip and covers the mounting surface at least partially,
wherein the encapsulation comprises a first layer formed from a first material and a second layer formed from a second material,
wherein the first layer is arranged between the mounting surface and the second layer,
wherein each of the first layer and the second layer is based on a silicone,
wherein at least 50% of polymers of the second material are silane and/or silanol functionalized,
wherein the first layer and the second layer are directly adjacent to each other in a region of an interface,
wherein the mounting surface at least partially comprises silver and/or a silver alloy and/or copper, and
wherein, on average at least 3% of functionalities of silane and/or silanol functionalized polymers are silane or silanol functionalities.

2. The optoelectronic component according to claim 1, wherein the first layer covers all regions of the mounting surface laterally adjacent to the semiconductor chip, and
wherein each path from outside the component to the first layer that passes exclusively through silicone-based material also passes through the interface.

3. The optoelectronic component according to claim 1, wherein the semiconductor chip is embedded in the first layer, and
wherein, viewed in a top view of the mounting surface, the semiconductor chip is covered by the interface.

4. The optoelectronic component according to claim 1, wherein the first layer and the second layer are based on the same silicone.

5. The optoelectronic component according to claim 1, wherein the first layer and the second layer are based on different silicones.

6. The optoelectronic component according to claim 5, wherein the silicone of the second layer comprises a smaller refractive index than that of the first layer.

7. The optoelectronic component according to claim 5, wherein the silicone of the second layer comprises a higher permeability for gases than that of the first layer.

8. The optoelectronic component according to claim 1, wherein the interface extends over the entire mounting surface of the carrier.

9. The optoelectronic component according to claim 1, wherein the first layer is surface-treated in the region of the interface.

10. The optoelectronic component according to claim 1, further comprising an inorganic encapsulation layer at least partially covering the mounting surface.

11. The optoelectronic component according to claim 10, wherein the inorganic encapsulation layer is arranged between the encapsulation and the carrier.

12. The optoelectronic component according to claim 1, wherein the semiconductor chip is a volume emitter.

13. The optoelectronic component according to claim 1, wherein the semiconductor chip is electrically conductively connected with the carrier via at least one contact wire, and
wherein the contact wire is embedded in the first layer and, as viewed in a top view, is covered by the interface.

14. The optoelectronic component according to claim 13, wherein the contact wire comprises silver.

15. A method for producing an optoelectronic component, the method comprising:
providing a carrier with a mounting surface;
applying an optoelectronic semiconductor chip to the mounting surface and electrically connecting the semiconductor chip with the carrier;
forming a silicone-based first layer on the mounting surface by applying a silicone-based first material in a liquid or viscous state to the mounting surface and by at least partially curing the first material, wherein the first layer subsequently forms around the semiconductor chip; and
forming a silicone-based second layer directly on a side of the first layer opposite the mounting surface by applying a silicone-based second material in a liquid or viscous state directly on the first layer and subsequently curing the second material,
wherein at least 50% of polymers of the second material are silane and/or silanol functionalized,
wherein the mounting surface at least partially comprises silver and/or a silver alloy and/or copper, and
wherein, on average at least 3% of functionalities of silane and/or silanol functionalized polymers are silane or silanol functionalities.

16. The method according to claim 15, further comprising surface treating a surface of the first layer facing away from the mounting surface prior to forming the silicone-based second layer.

17. The method according to claim 15, further comprising applying an inorganic encapsulation layer to the mounting surface prior to forming the silicone-based first layer.

18. The method according to claim 15 wherein at least 75% of the polymers of the second material are the silane and/or silanol functionalized, and wherein, on average, at least 50% of the functionalities of the silane and/or silanol functionalized polymers are the silane or silanol functionalities.

19. The method according to claim 15, wherein the carrier is a carrier composite having a plurality of interconnected carriers, and wherein the carrier composite is singulated after forming the silicone-based second layer.

* * * * *